United States Patent
Crosman, III

(10) Patent No.: US 11,874,342 B2
(45) Date of Patent: Jan. 16, 2024

(54) METHOD TO DETERMINE FUSE HEALTH

(71) Applicant: Caterpillar Inc., Peoria, IL (US)

(72) Inventor: Alexander C. Crosman, III, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 204 days.

(21) Appl. No.: 17/556,691

(22) Filed: Dec. 20, 2021

(65) Prior Publication Data

US 2023/0194632 A1    Jun. 22, 2023

(51) Int. Cl.
*G01R 31/74* (2020.01)
*B60R 16/033* (2006.01)

(52) U.S. Cl.
CPC ............ *G01R 31/74* (2020.01); *B60R 16/033* (2013.01)

(58) Field of Classification Search
CPC ...... G01R 31/74; G01R 31/007; G01R 31/52; G01R 31/385; G01R 19/165; G01R 31/379; G01R 31/3842; G01R 19/15; G01R 31/392; G01R 31/006; G01R 31/3277; G01R 31/3835; G01R 19/16538; B60R 16/033; B60R 16/03; B60R 16/0237; H01H 85/30; H02H 3/04; H01M 2220/20; H01M 2010/4271; H01M 10/4257; H01M 10/482; H01M 2200/103; H01M 2250/20
See application file for complete search history.

(56) References Cited

U.S. PATENT DOCUMENTS

| | | | |
|---|---|---|---|
| 8,031,455 B2 * | 10/2011 | Paik | H03M 1/129 361/104 |
| 8,625,244 B2 * | 1/2014 | Paik | H02H 3/0935 361/104 |
| 8,762,083 B2 | 6/2014 | Rodseth et al. | |
| 10,203,362 B2 * | 2/2019 | Liu | G01R 31/007 |
| 10,254,329 B2 | 4/2019 | Douglass et al. | |
| 10,348,080 B1 * | 7/2019 | Meng | G01R 31/007 |
| 2016/0341777 A1 | 11/2016 | Liu et al. | |

FOREIGN PATENT DOCUMENTS

| | | |
|---|---|---|
| CN | 206223902 | 6/2017 |
| CN | 108667382 | 2/2020 |
| CN | 109633364 | 12/2020 |
| DE | 102012209138 A1 | 12/2013 |
| DE | 102015216223 A1 | 3/2017 |
| EP | 2100357 B1 | 4/2014 |
| EP | 3723217 A1 | 10/2020 |
| WO | 2017078884 | 5/2017 |

OTHER PUBLICATIONS

Written Opinion and International Search Report for Int'l. Patent Appln. No. PCT/US2022/080968, dated Apr. 24, 2023 (12 pgs).

* cited by examiner

*Primary Examiner* — Vinh P Nguyen

(74) *Attorney, Agent, or Firm* — SCHWEGMAN LUNDBERG & WOESSNER, P.A.

(57) ABSTRACT

A method of monitoring a fuse of a work machine includes sensing a fuse current; detecting when the fuse current exceeds a threshold; quantifying a difference current that is a difference between the fuse current and the threshold current when the fuse current exceeds the threshold current; determining an amount of time that the difference current is greater than zero; and generating an alert related to fuse lifetime according to the difference current and determined time.

20 Claims, 4 Drawing Sheets

METHOD TO DETERMINE FUSE HEALTH

TECHNICAL FIELD

This document relates to electric powered work machines and in particular to techniques of monitoring the state of fuses in electric powered work machines.

BACKGROUND

Powering a large moving work machine (e.g., a wheel loader) with an electric motor requires a large mobile electric energy source that can provide current of hundreds of Amperes (Amps). This large mobile energy source can include multiple large capacity battery cells connected in parallel as battery strings that provide the sustained energy power needed by a large electric-powered moving work machine. High-capacity fuses protect equipment from excessive currents that can damage the equipment. These fuses can be located at the output of the energy or at the point where the current is delivered, such as an electric motor.

SUMMARY OF THE INVENTION

Electric powered large moving work machines use large capacity battery systems that source high currents needed to power the work machines. High-current fuses protect equipment from excessive currents that can damage the machine. It would be useful to know the state of the fuses of the work machine to avoid down time of the machine.

A fuse monitoring circuit for a work machine includes: a current sensing circuit configured to sense fuse current; and a controller circuit in electrical communication with the current sensing circuit. The controller circuit is configured to detect when the fuse current exceeds a threshold current; quantify a difference current that is a difference between the fuse current and the threshold current when the fuse current exceeds the threshold current; determine an amount of time that the difference current is greater than zero; and generate an alert related to fuse lifetime according to the difference current and determined time.

An example method of monitoring a fuse of a work machine includes sensing a fuse current; detecting when the fuse current exceeds a threshold; quantifying a difference current that is a difference between the fuse current and the threshold current when the fuse current exceeds the threshold current; determine an amount of time that the difference current is greater than zero; and generating an alert related to fuse lifetime according to the difference current and determined time.

An example battery system of a work machine includes at least one battery pack including multiple battery cells, the at least one battery pack including a fused output; a current sensing circuit configured to sense fuse current of the fused output; and a controller circuit in electrical communication with the current sensing circuit. The controller circuit is configured to: detect when the fuse current exceeds a threshold current; quantify a difference current that is a difference between the fuse current and the threshold current when the fuse current exceeds the threshold current; compute a square of the difference current; accumulate a sum of the squared difference current over time for which the fuse current exceeds the threshold current; and generate an alert related to fuse lifetime when the accumulated sum exceeds a predetermined sum threshold.

DETAILED DESCRIPTION

Examples according to this disclosure are directed to methods and systems for automatic monitoring of the state or health of a high-current fuse of a work machine. Monitoring the state of the fuses allows for predictive maintenance of the fuses of the electric system to avoid shutdown of the machine.

Figure 1:
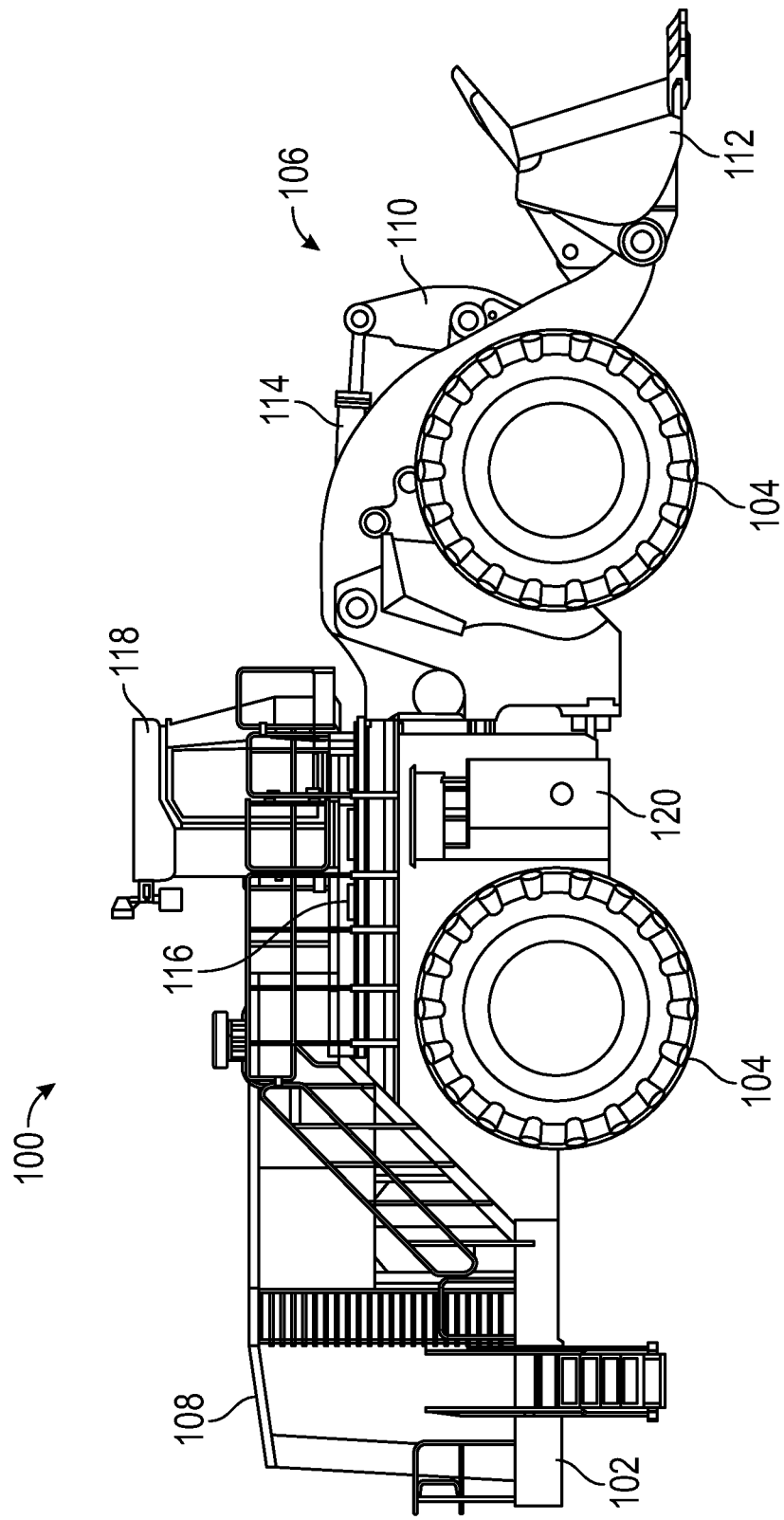
FIG. 1 is an elevation view depicting an example work machine in accordance with this disclosure.

FIG. 1 depicts an example machine 100 in accordance with this disclosure. In FIG. 1, machine 100 includes frame 102, wheels 104, implement 106, and a speed control system implemented in one or more on-board electronic devices like, for example, an electronic control unit or ECU. Example machine 100 is a wheel loader. In other examples, however, the machine may be other types of machines related to various industries, including, as examples, construction, agriculture, forestry, transportation, material handling, waste management, and so on. Accordingly, although a number of examples are described with reference to a wheel loader machine, examples according to this disclosure are also applicable to other types of machines including graders, scrapers, dozers, excavators, compactors, material haulers like dump trucks, along with other example machine types.

Machine 100 includes frame 102 mounted on four wheels 104, although, in other examples, the machine could have more than four wheels. Frame 102 is configured to support and/or mount one or more components of machine 100. For example, machine 100 includes enclosure 108 coupled to frame 102. Enclosure 108 can house, among other components, an electric motor to propel the machine over various terrain via wheels 104. In some examples, multiple electric motors are included in multiple enclosures at multiple locations of the machine 100.

Machine 100 includes implement 106 coupled to the frame 102 through linkage assembly 110, which is configured to be actuated to articulate bucket 112 of implement 106. Bucket 112 of implement 106 may be configured to transfer material such as, soil or debris, from one location to another. Linkage assembly 110 can include one or more cylinders 114 configured to be actuated hydraulically or pneumatically, for example, to articulate bucket 112. For example, linkage assembly 110 can be actuated by cylinders 114 to raise and lower and/or rotate bucket 112 relative to frame 102 of machine 100.

Platform 116 is coupled to frame 102 and provides access to various locations on machine 100 for operational and/or maintenance purposes. Machine 100 also includes an operator cabin 118, which can be open or enclosed and may be accessed via platform 114. Operator cabin 118 may include one or more control devices (not shown) such as, a joystick, a steering wheel, pedals, levers, buttons, switches, among other examples. The control devices are configured to enable the operator to control machine 100 and/or the implement 106. Operator cabin 118 may also include an operator interface such as, a display device, a sound source, a light source, or a combination thereof.

Machine 100 can be used in a variety of industrial, construction, commercial or other applications. Machine 100 can be operated by an operator in operator cabin 118. The operator can, for example, drive machine 100 to and from various locations on a work site and can also pick up and deposit loads of material using bucket 112 of implement 106. As an example, machine 100 can be used to excavate a portion of a work site by actuating cylinders 114 to articulate bucket 112 via linkage 110 to dig into and remove dirt, rock, sand, etc. from a portion of the work site and deposit this load in another location. Machine 100 can include a battery compartment connected to frame 102 and including a battery system 120. Battery system 120 is electrically coupled to the one or more electric motors of the machine 100.

Figure 2:
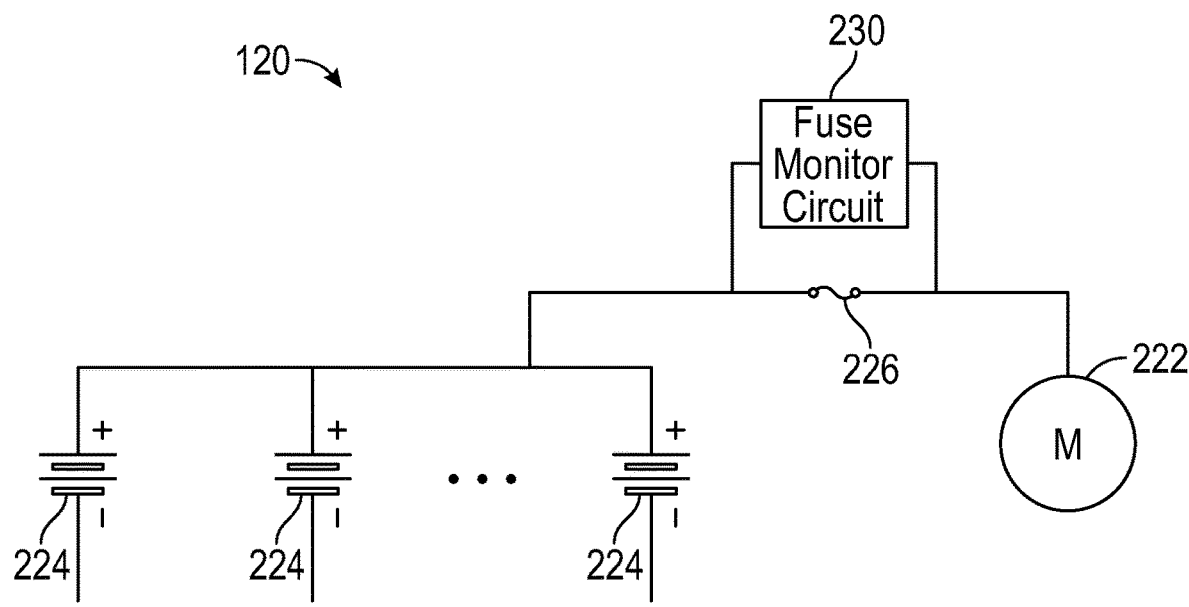
FIG. 2 is a block diagram of a fused battery system for a work machine in accordance with this disclosure.

FIG. 2 is a block diagram of a battery system 120. The battery system can be used to provide power to an electric motor 222 of a machine, such as the example machine 100 of FIG. 1. The battery system 120 includes multiple battery cells 224 (e.g., two to eight battery cells) connected in parallel. The battery cells 224 are large capacity battery cells (e.g., a 750 Volt, 80 Amp-hour battery, or 60 kilowatt-hours). The battery cells 224 may be included in one battery pack or multiple battery packs connected in parallel in the battery system. The battery system 120 includes a fuse element. One fuse 226 is shown for simplicity of the diagram. An actual implementation may include multiple battery packs and multiple fuses. The fuse 226 may be located at the output of the battery system 120 or located at the electric motor 222.

During operation of an electric work machine, large currents are cycled through the machine and the fuses. The large currents expose the fuses to heating and cooling cycles. Fuses used in cyclic high-current applications typically include an inert material (e.g., sand). Excessive heating from high currents can cause damage to the fuses. In an over current situation, an arc across the fuse can turn the inert packing material into an insulator (e.g., glass). In the event of an overcurrent problem, the fuse open circuit and the insulating material of the high-current fuse provides protection.

High-current fuses are subjected to significant changes in temperature as the fuse current rises and falls. Over time, this thermal cycling can lead to wear on the fuse due to thermal growth and shrinkage of the fuse material. In an extreme case, the wear could lead to a fuse element that no longer provides overcurrent protection as originally designed. This could cause the fuse 226 to open at less than the design current, shutting down the circuit the fuse is included in and causing nuisance machine downtime. The thermal cycling damage to the fuse may take the form of scuffing against inert packing material within the fuse, distortion of the fuse element due to excessive thermal growth, or work-hardening of the element material due to repeated heating and cooling. The battery system 120 includes fuse monitoring circuit 230 to monitor the condition of the fuse 226 or fuses of the work machine. Based on the condition of the fuse, a notification can be provided to alert an operator or a maintenance technician that the fuse will need replacement soon. This avoids nuisance shutdown of the work machine.

Figure 3:
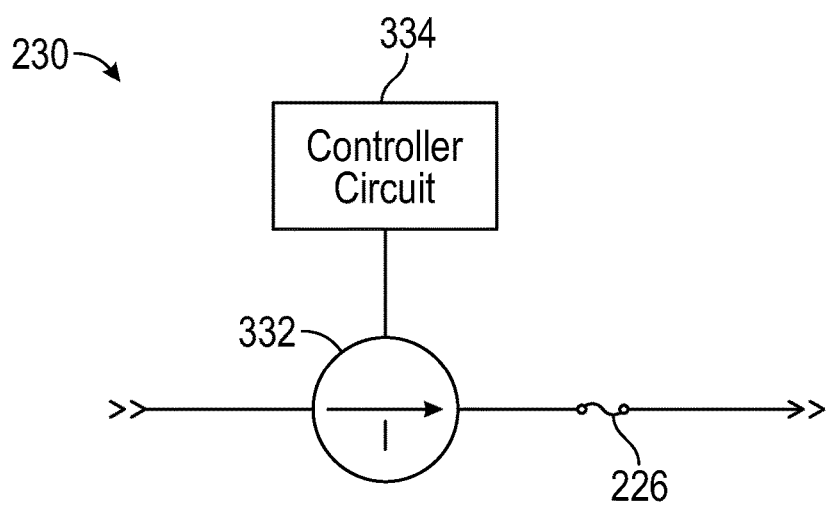
FIG. 3 is a block diagram of a fuse monitoring circuit in accordance with this disclosure.

FIG. 3 is a block diagram of a fuse monitoring circuit 230. The fuse monitoring circuit 230 includes a current sensing circuit 332 and a controller circuit 334. The current sensing circuit 332 senses the fuse current. In the example of FIG. 3, the current sensing circuit 332 is shown in series with the fuse. In certain examples, the current sensing circuit 332 includes a resistance (e.g., a high current resistor) and the voltage across the resistance is used to produce a signal representative of fuse current. In certain examples, the current sensing circuit 332 includes a magnetic current sensor (e.g., a hall effect sensor) and is not in series with the fuse 226. The magnetic current sensor generates a signal representative of fuse current.

The controller circuit 334 may include processing circuitry that includes logic to perform the functions described. The processing circuitry may include a microprocessor, application specific integrated circuit (ASIC), field programmable gate array (FPGA), or other type of processor, interpreting or executing instructions in software or firmware. The controller circuit 334 uses the sensed fuse current signal to calculate an estimate of the fuse lifetime used by operation of the work machine.

The calculation of fuse health by the controller circuit 334 can be made by observing the number of times the fuse current exceeds some threshold and the amount of time the current is above the threshold each time it exceeds the threshold. The concept assumes that below this threshold current, the thermal growth of the fuse element material is small and not likely to cause long-term damage, but that above this threshold current cumulative damage to the fuse can occur.

Figure 4:
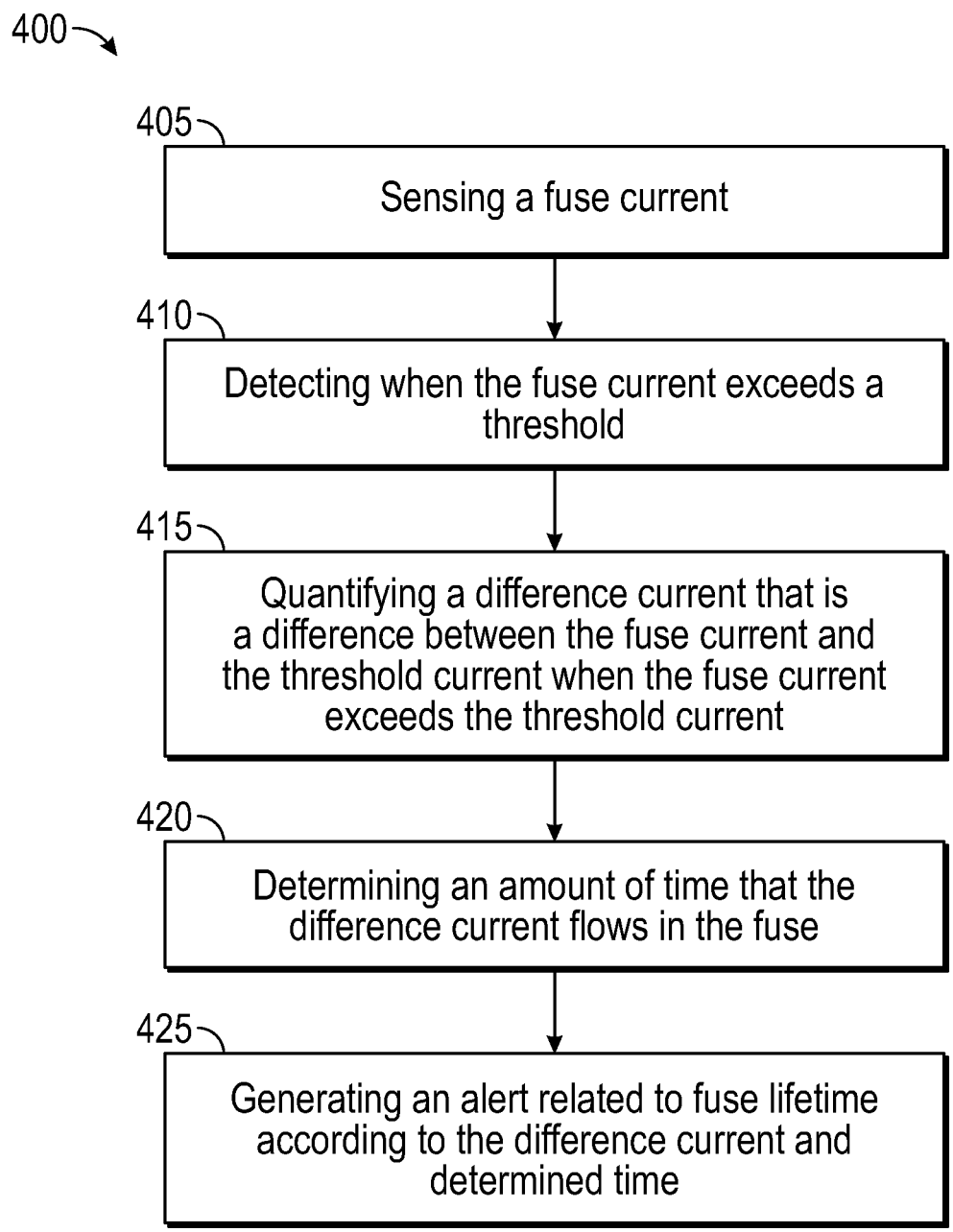
FIG. 4 is a flow diagram of an example of a method of operating a fuse monitoring circuit in accordance with this disclosure.

FIG. 4 is a flow diagram outlining this approach to monitoring fuse health. The method can be implemented using the controller circuit 334 of FIG. 3. At block 405, the fuse current is sensed. At block 410, the controller circuit detects when the sensed fuse current is greater than a predetermined threshold current. The threshold current may be a percentage of the absolute current rating of the fuse. For example, the threshold current may be 80%-90% of the maximum current rating. In certain examples a comparator circuit is used to determine when the sensed fuse current signal exceeds the threshold current level. In certain examples, the controller circuit include a quantifier circuit (e.g., an analog-to-digital converter or ADC circuit). The controller circuit 334 determines when the quantified current signal is greater than the threshold current level.

At block 415, a difference current is quantified. The difference current is the difference between the fuse current and the threshold current when the fuse current exceeds the threshold current. The controller circuit may quantify the difference current by subtracting the threshold current level from the quantified current signal.

At block 420, the amount of time that the difference current is greater than zero is determined. The controller circuit 334 keeps track of the accumulated time that the fuse current is greater than the threshold current and keeps track of the magnitude of the currents in the fuse when the fuse is greater than the threshold current. At block 425, the controller circuit generates an alert related to fuse lifetime according to the determined difference current and determined time. The controller circuit 334 may present an alert on a display of a user interface of the machine. The alert may be an indication that the fuse should be replace soon. In certain examples, the alert is a signal sent to another process executing on a different device. In certain examples, the alert is a value stored in memory of the controller circuit 334 indicating status of the fuse, and the status of the fuse can be later downloaded from the memory as part of maintenance.

Figure 5:
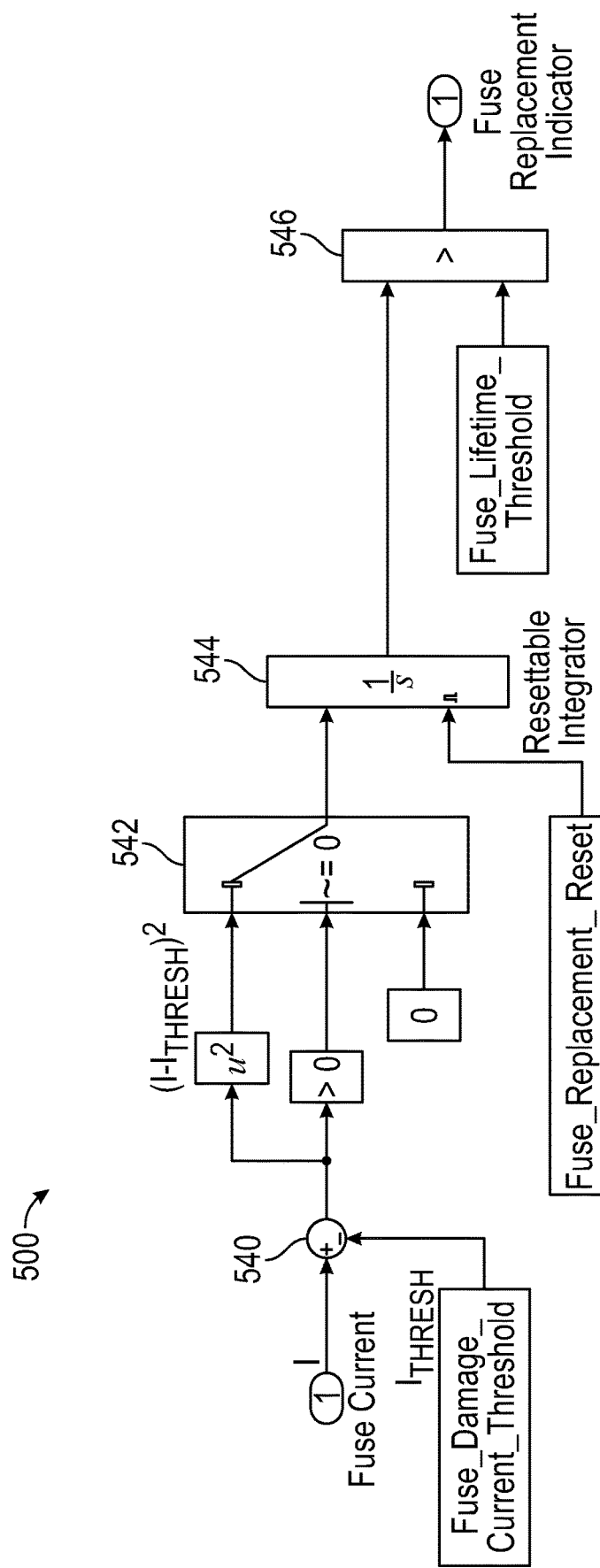
FIG. 5 is a flow diagram of an example of an algorithm that can be implemented using a fuse monitoring circuit in accordance with this disclosure.

FIG. 5 is a diagram of an example an algorithm 500 performable by the controller circuit 334 to calculate fuse health. Fuse heating is proportional to fuse power loss, given by $$I^2 * R_{fuse},$$

where I is the fuse current and $R_{fuse}$ is the fuse resistance. Damage to fuse elements can be caused by excessive heating and cooling. Total cumulative damage is estimated by integrating the total energy above a threshold, $$(I-I_{thresh})^2,$$

to which the fuse is exposed. Thus, cumulative damage can be determined using the square of the difference between the actual current and the threshold current when the actual fuse current is above the threshold.

In the example of FIG. 5, the sensed value of fuse current I is input to summing node 540. The threshold current $I_{thresh}$ is subtracted from the fuse current, and the result is a difference current $(I-I_{thresh})$. The value of the difference current determines which input of the multiplexer 542 is applied to integrator 544. If the difference current is greater than zero, the top input to the multiplexer is selected and the squared value of the difference current $(I-I_{thresh})^2$ is applied to the integrator 544. If the difference current is less than or equal to zero, the fuse current is less than the threshold current. The bottom input of the multiplexer is selected and "0" is output from the multiplexer 542.

The integral of $(I-I_{thresh})^2$ accumulates with time when the fuse current is greater than the threshold current. The integral does not accumulate further when the fuse current is less than the threshold current. At comparator 546 the accumulated integral is compared with a value (Fuse_Lifetime_Threshold) that represents the estimated lifetime of the fuse. When the integral exceeds that lifetime, an indication is presented to the operator or maintenance technician that the fuse should be replaced to prevent nuisance shutdowns of the protected circuit.

The integrator 544 includes a reset (Fuse_Replacement_Reset) that allows the integrator and the accumulated integral to be reset to zero. A maintenance technician can reset this lifetime accumulator when the fuse is replaced.

The controller circuit may implement the algorithm for multiple fuses to monitor the health of multiple fuses of the work machine. The multiple fuses may include fuses for multiple motors, multiple battery packs, etc. Thus, the methods, devices, and systems described herein provide notification of the state of the fuses of the machine during routine maintenance or operation of the machine. Unexpected shutdown of the machine due to blown fuses is avoided.

INDUSTRIAL APPLICABILITY

In an example of real time monitoring of fuse lifetime, the number of times that the fuse current exceeds a predetermined threshold current and the amount of time and the amount of current above the threshold is tracked using a running summation or integral. When the fuse current is below the threshold current the thermal growth of the fuse is small and not likely to cause long term damage to the fuse. The accumulated summation or integral is compared to an accumulation value representing the near end of useful lifetime of the fuse. When the accumulated summation or integral exceeds the accumulation value, an indication is provided that brings the status of the fuse to the attention of the operator a maintenance technician.

The above detailed description is intended to be illustrative, and not restrictive. The scope of the disclosure should, therefore, be determined with references to the appended claims, along with the full scope of equivalents to which such claims are entitled.

What is claimed is:

1. A fuse monitoring circuit for a work machine, comprising:
   a current sensing circuit configured to sense fuse current; and
   a controller circuit in electrical communication with the current sensing circuit and configured to:
     detect when the fuse current exceeds a threshold current;
     quantify a difference current that is a difference between the fuse current and the threshold current when the fuse current exceeds the threshold current;
     determine an amount of time that the difference current is greater than zero; and
     generate an alert related to fuse lifetime according to the difference current and determined time.

2. The fuse monitoring circuit of claim 1, wherein the controller circuit is configured to:
   compute a square of the difference current;
   accumulate a sum of the squared difference current over time for which the fuse current exceeds the threshold current; and
   generate the alert when the accumulated sum exceeds a predetermined sum threshold.

3. The fuse monitoring circuit of claim 1, wherein the controller circuit is configured to:
   compute a square of the difference current;
   compute an integral of the squared difference current over time for which the fuse current exceeds the threshold current; and
   generate an alert when the computed integral exceeds a predetermined integral threshold.

4. The fuse monitoring circuit of claim 1, wherein the threshold current is eighty percent to ninety percent (80%-90%) of the maximum current rating of the fuse.

5. The fuse monitoring circuit of claim 1, wherein the fuse monitoring circuit is connected to a fuse that receives output current from a battery pack that includes multiple battery cells.

6. The fuse monitoring circuit of claim 1, wherein the fuse monitoring circuit is connected to a fuse that receives current delivered to an electric motor of the work machine.

7. A method of monitoring a fuse of a work machine, the method comprising:
   sensing a fuse current;
   detecting when the fuse current exceeds a threshold;
   quantifying a difference current that is a difference between the fuse current and the threshold current when the fuse current exceeds the threshold current;
   determining an amount of time that the difference current is greater than zero; and
   generating an alert related to fuse lifetime according to the difference current and determined time.

8. The method of claim 7, including:
   computing a square of the difference current;
   accumulating a sum of a computed square of the difference current over time for which the fuse current exceeds the threshold current; and
   generating the alert related to fuse lifetime when the accumulated sum exceeds a predetermined sum threshold.

9. The method of claim 8,
   wherein accumulating the sum includes computing an integral of the squared difference current over time for which the fuse current exceeds the threshold current; and wherein generating the alert includes generating the alert when the computed integral exceeds a predetermined integral value threshold.

10. The method of claim 7, wherein generating the alert includes presenting the alert related to fuse lifetime on a display screen of a user interface of the work machine.

11. The method of claim 7, wherein sensing the fuse current includes sensing output current from a battery pack that includes multiple battery cells.

12. The method of claim 7, wherein sensing the fuse current includes sensing current provided to an electric motor.

13. The method of claim 7, wherein computing the difference current includes computing a difference current that is a difference between the sensed fuse current and a threshold current that is eighty percent to ninety percent (80%-90%) of the maximum current rating of the fuse.

14. A battery system of a work machine, the system comprising:
at least one battery pack including multiple battery cells, the at least one battery pack including a fused output;
a current sensing circuit configured to sense fuse current of the fused output; and
a controller circuit in electrical communication with the current sensing circuit and configured to:
detect when the fuse current exceeds a threshold current;
quantify a difference current that is a difference between the fuse current and the threshold current when the fuse current exceeds the threshold current;
compute a square of the difference current;
accumulate a sum of the squared difference current over time for which the fuse current exceeds the threshold current; and
generate an alert related to fuse lifetime when the accumulated sum exceeds a predetermined sum threshold.

15. The system of claim 14, wherein the controller circuit is configured to:
compute an integral of the squared difference current over time for which the fuse current exceeds the threshold current; and
generate the alert when the computed integral exceeds a predetermined integral threshold.

16. The system of claim 14, wherein the threshold current is eighty percent to ninety percent (80%-90%) of the maximum current rating of the fuse.

17. The system of claim 14, including a fuse disposed in the fused output of the battery pack, wherein the fuse is rated to 350 Amperes.

18. A non-transitory computer-readable storage medium including instructions that, when performed by a hardware processor of a fuse monitoring circuit of a work machine, cause the fuse monitoring circuit to perform operations comprising:
detecting when a fuse current exceeds a threshold current;
quantifying a difference current that is a difference between the fuse current and the threshold current when the fuse current exceeds the threshold current;
determining an amount of time that the difference current is greater than zero; and
generating an alert related to fuse lifetime according to the difference current and determined time.

19. The non-transitory computer-readable storage medium of claim 18, including instructions that cause the battery pack to perform operations including:
computing a square of the difference current;
accumulating a sum of the squared difference current over time for which the fuse current exceeds the threshold current; and
generating the alert when the accumulated sum exceeds a predetermined sum threshold.

20. The non-transitory computer-readable storage medium of claim 18, including instructions that cause the battery pack to perform operations including:
computing a square of the difference current;
computing an integral of the squared difference current over time for which the fuse current exceeds the threshold current; and
generating an alert when the computed integral exceeds a predetermined integral threshold.

* * * * *